United States Patent
Palm

(10) Patent No.: US 8,662,377 B2
(45) Date of Patent: Mar. 4, 2014

(54) METHOD FOR SECURING ELECTRONIC COMPONENTS TO A SUBSTRATE

(75) Inventor: Gerhard Palm, Sickte (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 376 days.

(21) Appl. No.: 11/112,803

(22) Filed: Apr. 22, 2005

(65) Prior Publication Data

US 2005/0247760 A1 Nov. 10, 2005

(30) Foreign Application Priority Data

Apr. 22, 2004 (DE) .......................... 10 2004 019 567
Nov. 24, 2004 (DE) .......................... 10 2004 056 702

(51) Int. Cl.
*B23K 35/12* (2006.01)

(52) U.S. Cl.
USPC .............................. 228/253; 228/245; 228/249

(58) Field of Classification Search
USPC .............. 228/193, 178, 179.1, 190, 199, 225, 228/245, 249; 156/89.11–89.28, 230, 235, 156/238, 241
See application file for complete search history.

(56) References Cited

U.S. PATENT DOCUMENTS

| | | | | |
|---|---|---|---|---|
| 3,110,961 A | * | 11/1963 | Melill et al. .................. | 228/181 |
| 3,641,660 A | * | 2/1972 | Adams et al. ............... | 228/180.5 |
| 3,785,895 A | * | 1/1974 | Ettre et al. .................. | 156/89.12 |
| 3,961,961 A | * | 6/1976 | Rich .............................. | 430/263 |
| 4,358,349 A | * | 11/1982 | Masami et al. ............... | 205/126 |
| 4,406,367 A | * | 9/1983 | Bouwknegt ................... | 206/714 |
| 4,810,672 A | * | 3/1989 | Schwarzbauer ........... | 228/123.1 |
| 4,874,842 A | * | 10/1989 | Johns et al. ................... | 528/494 |
| 4,961,804 A | * | 10/1990 | Aurichio ....................... | 156/248 |
| 5,058,796 A | * | 10/1991 | Schwarzbauer ............. | 228/44.3 |
| 5,362,681 A | * | 11/1994 | Roberts et al. ................ | 438/464 |
| 5,506,032 A | * | 4/1996 | Rowe ............................. | 428/178 |
| 5,599,595 A | * | 2/1997 | McGinley et al. .............. | 428/33 |
| 6,743,319 B2 | * | 6/2004 | Kydd ............................ | 156/230 |

FOREIGN PATENT DOCUMENTS

| | | |
|---|---|---|
| DE | 3414065 C2 | 12/1985 |
| DE | 197 34 317 | 2/1999 |
| DE | 10 2004 019 567 | 1/2006 |
| DE | 10 2004 056 702 | 3/2006 |
| EP | 0 242 626 B1 | 10/1987 |
| EP | 0 283 197 | 9/1988 |
| EP | 0 949 662 | 10/1999 |
| JP | 54 019 363 | 2/1979 |
| JP | 54-19363 | 2/1979 |
| JP | 60 063 939 | 4/1985 |
| JP | 3 046 242 | 2/1991 |
| JP | 6-63939 | 3/1994 |
| WO | WO 03/035279 | 5/2003 |

* cited by examiner

*Primary Examiner* — Maria Veronica Ewald
*Assistant Examiner* — Megha Mehta
(74) *Attorney, Agent, or Firm* — The Law Offices of Roger S. Thompson

(57) ABSTRACT

A method for securing electronic components, in particular power semiconductor components such as diodes, transistors or thyristors, and connection elements, to a substrate by pressure sintering. The method includes: applying a pastelike layer, made up of a metal powder and a solvent, to a supporting film; drying the pastelike layer; applying at least one component to the dried layer; subjecting the at least one component, the supporting film and the dried layer to pressure, as a result of which the adhesive force between the layer and the component becomes greater than that between the layer and the supporting film; lifting off the at least one component, with the layer adhering to it, from the supporting film; positioning the component, with the layer adhering to it, to the substrate; and subjecting the substrate and the component to pressure, for connecting them by sintering.

12 Claims, 4 Drawing Sheets

METHOD FOR SECURING ELECTRONIC COMPONENTS TO A SUBSTRATE

BACKGROUND OF THE INVENTION

1. Field of the Invention

The invention is directed to methods for securing electronic components, in particular power semiconductor components such as diodes, transistors or thyristors, to a substrate and for securing connection elements to these components or to the substrate. The methods involve a well-known sintering method.

2. Description of the Related Art

The basic prior art in this respect is defined by German Patent DE 34 14 065 C2 and European Patent Disclosure EP 0 242 626 B1. DE 34 14 055 C2 discloses a method for joining an electronic component to a substrate that is characterized by the following essential processing steps:

Applying a pastelike layer, comprising a metal powder and a solvent, to a contact face of the component or of the substrate;

Applying the component to the substrate, with the pastelike layer disposed between the component and the substrate;

Expelling the solvent from the composite comprising the component, the pastelike layer, and the substrate;

Heating the composite to sintering temperature, preferably while applying pressure thereto.

A disadvantage of this method is that the process of drying the pastelike layer is performed after the component and the substrate are joined together. Since fast outgassing over a large surface area is not possible under these circumstances, this method is characterized by considerable process times. EP 0 242 626 B1, by comparison, discloses a method for joining an electrical component to a substrate that is characterized by the following essential processing steps:

Applying a pastelike layer, comprising a metal powder and a solvent, to a contact face of the component or of the substrate;

Drying the pastelike layer;

Applying the component to the substrate, the dried pastelike layer being disposed between the component and the substrate;

Heating the composite to sintering temperature, while subjecting it to additional pressure.

This method avoids the primary disadvantage of German Patent DE 34 14 065 C2. However, this method, like the first, has the disadvantage of being a purely serial method, which is an obstacle to modern, rational production of such bonds or connections.

Another disadvantage of the methods named is that a structured application of the pastelike layer to the component or to the substrate is possible only with considerable effort.

SUMMARY OF THE INVENTION

The object of the present invention is to present a method for securing electronic components to a substrate and for securing connection elements by means of pressure sintering, which is accessible to rational and at least partly parallel processing of a plurality of components and thus makes a structured design of the sintered layer possible.

The methods of the invention for securing electronic components, particularly power semiconductor components, such as diodes, transistors or thyristors, to a substrate and for securing connection elements, by means of pressure sintering are characterized by the following method steps:

a) Applying a pastelike layer to a supporting film. This layer in the prior art comprises a mixture of a metal powder and a solvent;

b) Drying the pastelike layer;

c) Applying at least one, and advantageously a plurality of, components to the dried layer. The components here are preferably disposed on a supporting film spread out over a frame;

d) Subjecting the composite comprising the at least one component and the supporting film with the dried layer to pressure. As a result, the adhesive force between the adhesive layer and the component becomes greater than the adhesive force between the layer and the supporting film;

e) Lifting off the at least one component, with the layer adhering to it, from the supporting film;

f) Positioning the at least one component, with the layer adhering to it, to the substrate; and g) Subjecting the arrangement of the substrate and the at least one component to pressure, thereby creating a sintered connection.

For a nonhomogeneous application of the pastelike layer to the component, the supporting film is suitably structured before process step (a). To that end, by known techniques, recesses are made in the film. Upon application of the layer, the layer is thus directly structured without further effort. This structure is then equally simply transferred to the components in process step (c).

According to an alternative embodiment of the invention, the connection elements (or components) can be secured as follows:

a) Applying a pastelike layer to a first, already structured supporting film. This layer once again comprises the mixture of a metal powder and a solvent;

b) Drying the pastelike layer;

c) Applying a second film, designed as thinner than the first, to the dried layer;

d) Subjecting the composite comprising the first supporting film and the second film with the dried layer to pressure, as a result of which the adhesive force between the dried layer and the second film becomes greater than that between the dried layer and the supporting film;

e) Lifting the second film, with the layer adhering to it, from the supporting film;

f) Positioning separated metal chips, formed of the dried layer, on a component or on the substrate; and g) Subjecting the arrangement of the substrate, and the component and connection element, or the arrangement of the substrate and the connection element, each with metal chips disposed between them, to pressure, for mutually connecting them by sintering.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The inventive concept of both methods will be described as examples below in conjunction with FIGS. 1 through 8.

DETAILED DESCRIPTION OF THE PRESENTLY PREFERRED EMBODIMENTS

Figure 1:
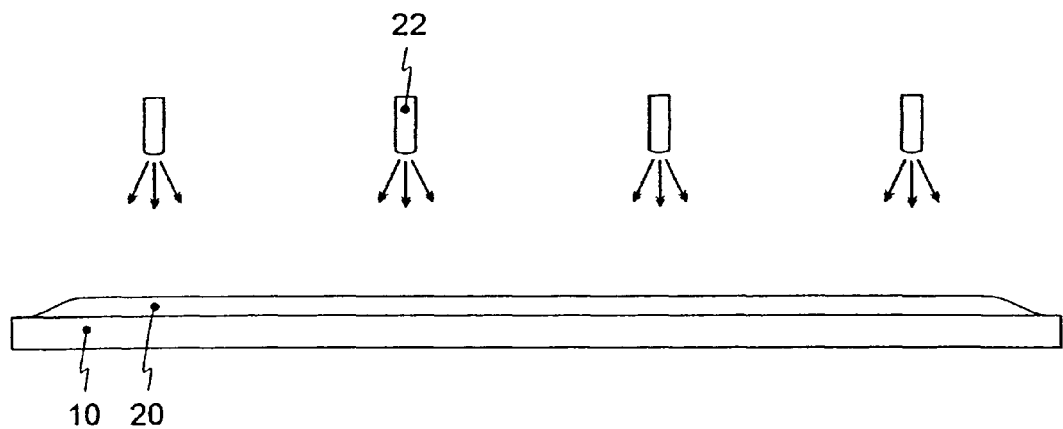
FIG. 1 shows a first method step of one method for performing the invention.

FIG. 1 shows a first method step of a first method for practicing the invention. A base is formed by an electronic supporting structure, such as a supporting film 10, preferably a polyester film with a thickness of between approximately 100 μm and approximately 200 μm. A pastelike layer 20 is applied to supporting film 10 by a spray 22. Other-known methods for applying layer 20, such as screenprinting, are equally suitable. Pastelike layer 20 comprises a mixture of a metal powder, preferably silver or a silver alloy, with cyclohexanol in a ratio of from approximately 1:2 to approximately 1:4. Pastelike layer 20 is preferably between approximately 10 μm and approximately 50 μm thick.

To coat components not simply two-dimensionally, but rather in structured form, as may be necessary for control terminals, for instance, supporting film 10 is formed before pastelike layer 20 is applied.

After application to supporting film 10, pastelike layer 20 is dried at a temperature of between approximately 100° C. and approximately 200° C.

Figure 2:
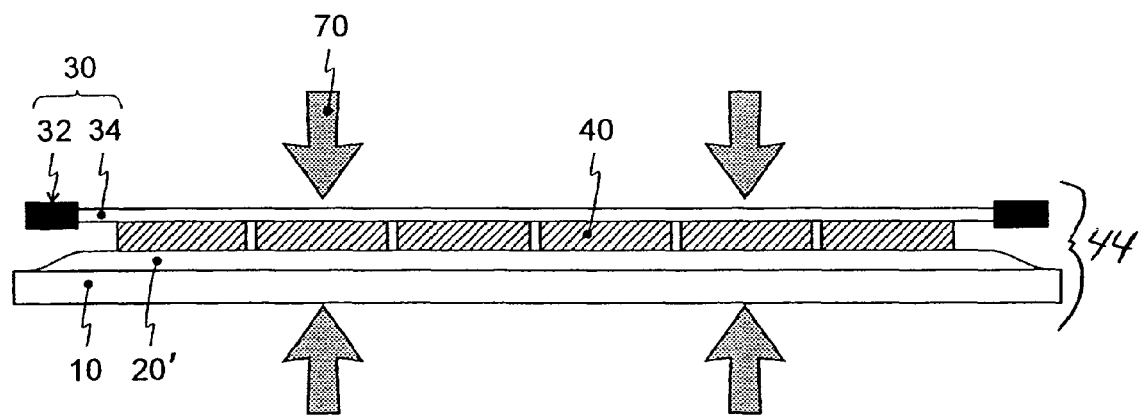
FIG. 2 shows succeeding method step of the first method of the invention.

Next, as shown in FIG. 2, an electronic structure, such as components 40, is applied to the now dried layer 20'. Components 40 in the prior art are disposed on a carrier device 30 made up of a film 34 spread out in a frame 32. This arrangement of components 40 requires no additional work step, since the final production step in the manufacture of semiconductor components is sawing apart the components in a wafer composite, and for that purpose components 40 are placed on carriers such as carrier device 30. Thus, components 40 are left on carrier device 30, as is also usual for other processing steps, known from the prior art, for unpackaged components. Supporting film 10, dried layer 20', components 40 and carrier device 30 together form a composite 44.

Composite 44 is then heated and subjected to a pressure 70. A pressure of between approximately 20 MPa and approximately 80 MPa and a temperature of between approximately 40° C. and approximately 100° C. have proved advantageous. The pressure introduced is sufficient to establish a bond between component 40 and dried layer 20' that has a higher adhesive force than the bond between supporting film 10 and component 40.

Figure 3:
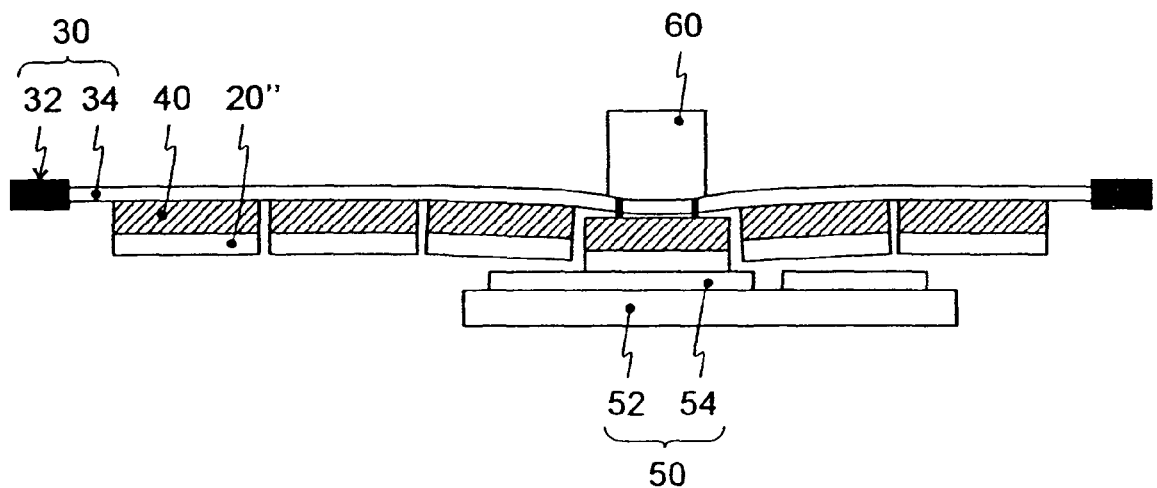
FIG. 3 shows succeeding method steps of the first method of the invention.

In a further method step shown in FIG. 3, the coated components 40, and dried layer 20" are detached from the composite and a substrate 50, having a conductor track 52 and at least one contract face 54 is disposed at those points where the bond between components 40 and substrate 50 is to be established. Extracting devices such as a die 60 may be used, of the kind known from so-called pick-and-place robots in semiconductor component processing. Here, die 60, which is equipped with a system of needles, presses against supporting film 34 of carrier device 30 from the side opposite component 40. Component 40 is thus lifted off from at least supporting film 34, and is completely separated therefrom by means of the needle system of die 60, which pierces film 32. Thus, with known techniques, individual components 40 can be positioned arbitrarily on conductor track 52 of substrate 50.

Figure 4:
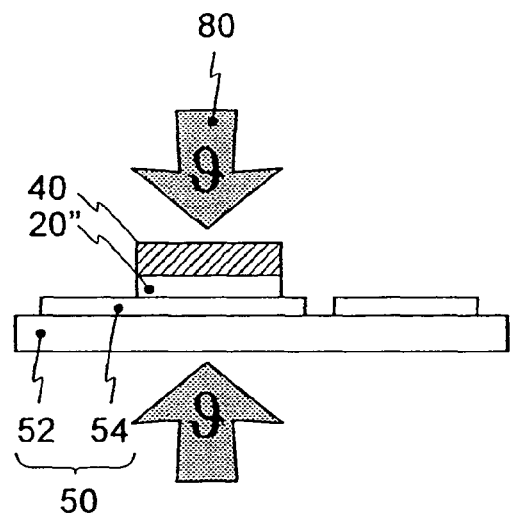
FIG. 4 shows a final method step of the first method of the invention.

In a concluding method step shown in FIG. 4, the arrangement comprising component 40, deposited layer 20" and substrate 50 is subjected to pressure of more than approximately 30 MPa. With simultaneous heating (θ) to values of more than approximately 220° C., the sintered connection is established.

Figure 5:
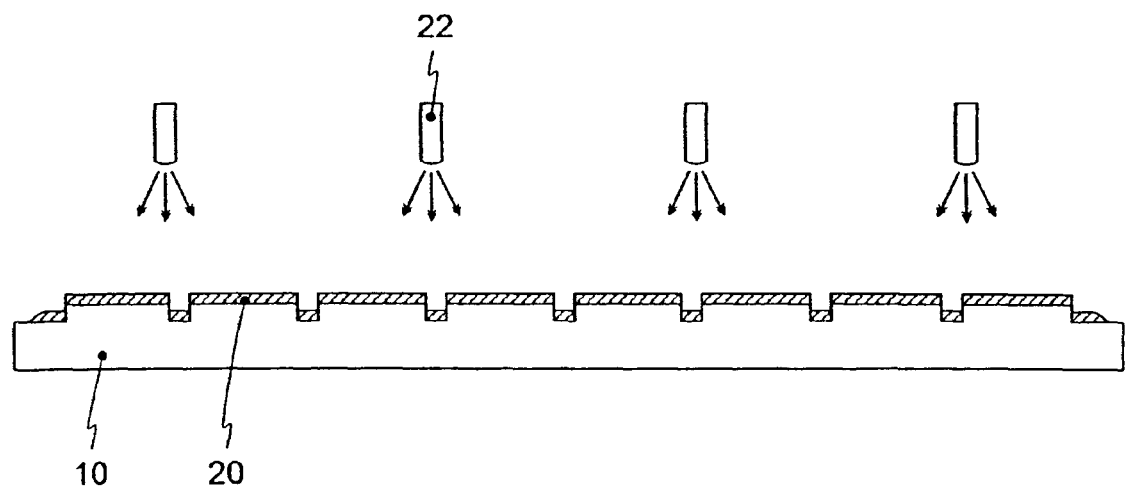
FIG. 5 shows a first method step of a second method for practicing the invention.

FIG. 5 shows a first method step of a second method of practicing the invention. Once again, a base is formed by a supporting film 10. Advantageously, this film has already been structured before starting this method step, such as, for example, by embossing. By means of spray 22, pastelike layer 20 is applied to supporting film 10.

Structuring supporting film 10 simultaneously with the method step of coating supporting film 10 serves to uncover a plurality of two-dimensional regions of the metal powder layer in a single method step. Thus, individual, arbitrarily shaped, two-dimensional regions are already created in this method step. Alternatively, exposing individual regions can be done not until a later method step, for instance after the method step illustrated in FIG. 6.

After pastelike layer 20 is applied to supporting film 10, it is dried at a temperature of between approximately 100° C. and approximately 200° C.

Figure 6:
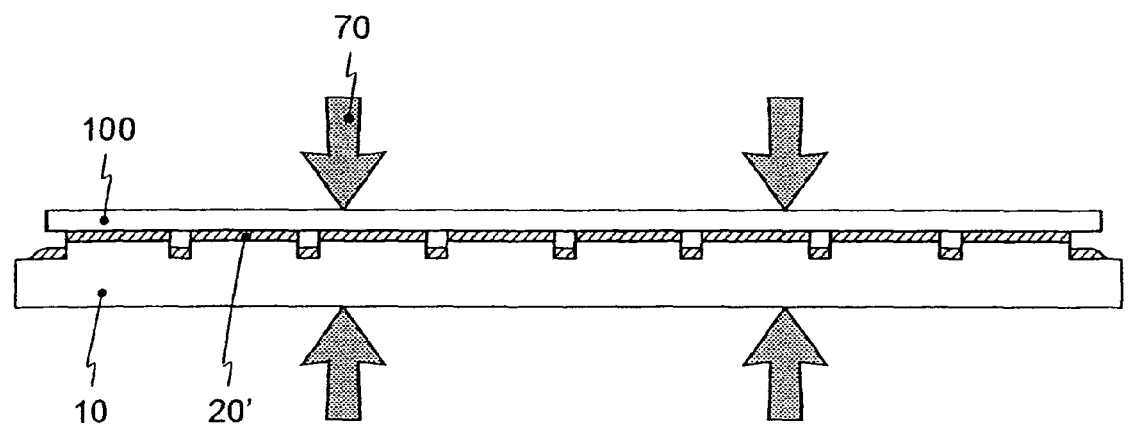
FIG. 6 shows a succeeding method step of the second method of the invention.

A second film 100 is applied to the dried layer 20' (FIG. 6). Second film 100 is thinner than first supporting film 10, preferably in the range of between approximately 10 μm and approximately 100 μm. Next, the composite of the supporting film 10, dried layer 20', and second film 100 is subjected to a pressure 70 of between approximately 20 MPa and approximately 80 MPa and a temperature of between approximately 40° C. and approximately 100° C. The pressure introduced here is sufficient to form a bond between second film 100 and dried layer 20' that has a higher adhesive force than the bond between supporting film 10 and dried layer 20'.

Next, second film 100, with dried layer 20' adhering thereto, is lifted off from first supporting film 10. If first supporting film 10 was already structured, individual metal chips 24 now adhere to second supporting film 100. If first supporting film 10 was not already structured, this is now done.

Figure 7:
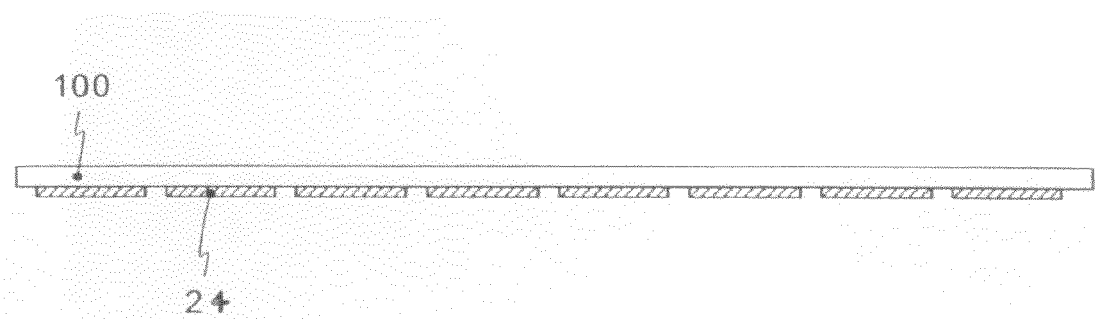
FIG. 7 shows a succeeding method step of the second method of the invention.

FIG. 7 shows second film 100 with arbitrarily shaped metal chips 24 adhering thereto it. Metal chips 24 are disposed on a component or the substrate in the next method step. A "pick and place" robot as mentioned above is suitable for performing this function.

Figure 8:
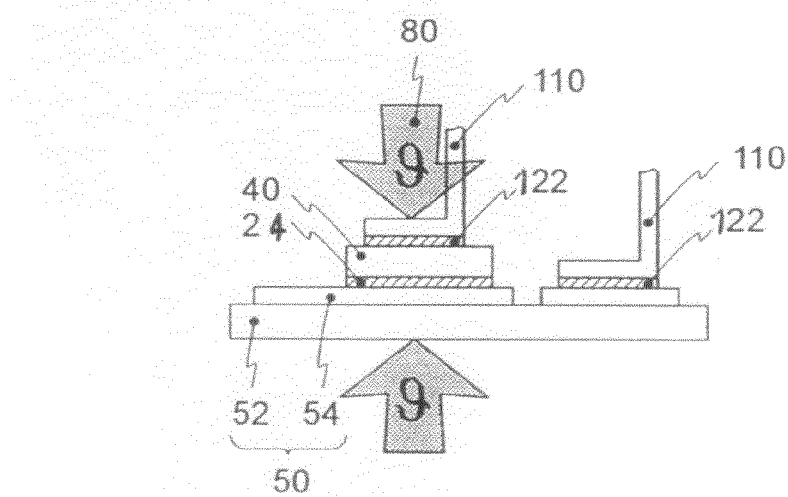
FIG. 8 shows a first method step of the second method of the invention.

FIG. 8 shows the disposition of a component 40 on a substrate 50 with metal chips 24 disposed therebetween as in FIG. 4. On this component 40, as described above, a further metal chip 122 is now disposed, and a connection element 110 is disposed thereon. Connection element 110 can provide an external connection to component 40, or bond it to further components or further contact faces 54 of substrate 50. Some metal chips 122 are likewise disposed on contact faces 54 of the substrate 50, and in turn connection elements 110 are disposed on these metal chips. These connection elements, as already described, connect components 40 or provide an external connection therefor.

In a concluding method step, the arrangement comprising the substrate 50, metal chips 24 component 40, further metal chips 122, and connection element 110, is subjected to pressure of more than approximately 30 MPa. With simultaneous heating (0) to a temperature of more than approximately 220° C., a sintered connection is established. The arrangement comprising substrate 50, metal chips 122 and connection element 110 is likewise subjected to pressure and temperature in the same way and once again the sintered connection is thus established.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for securing a first an electronic structure to an electronic supporting structure by pressure sintering, the method comprising:
  a) applying a pastelike layer, comprising a metal powder and a solvent, directly to a first, structured supporting film;
  b) disposing the electronic structure on said pastelike layer;
  c) drying said pastelike layer, thereby forming metal chips, on said first, structured supporting film;
  d) applying a second film, thinner than said first, structured supporting film, to said electronic structure on a side thereof which is opposed to said dried pastelike layer;
  e) subjecting said first, structured supporting film, said dried pastelike layer, the electronic structure and said second film to pressure, whereby the adhesive force between said dried pastelike layer and the electronic structure becomes greater than the adhesive force between said dried pastelike layer and said first, structured supporting film and causes said metal chips of said dried pastelike layer to adhere at least partly to the electronic structure;
  f) removing said second film, and the electronic structure with said dried pastelike layer adhering thereto, from said first, structured supporting film;
  g) applying at least one of the electronic supporting structure and a conductor track to said dried, pastelike layer adhered to the first electronic structure;
  h) removing said second film from the electronic structure; and
  i) subjecting said at least one of said conductor track and the electronic supporting structure with the electronic structure and metal chips of said dried pastelike layer disposed therebetween, to pressure, for mutually connecting them by sintering.

2. The method of claim 1, wherein said electronic structure is an electronic component, and said electronic supporting structure is a substrate.

3. The method of claim 1, wherein said electronic structure is a connection element and said electronic supporting structure is one of an electronic component and a substrate.

4. The method of claim 1, wherein said supporting film comprises a polyester film having a thickness of between approximately 100 µm and approximately 200 µm.

5. The method of claim 1, wherein said second film is structured to coat said electronic structure in structured form.

6. The method of claim 1, wherein said dried pastelike layer comprises a mixture of silver powder with cyclohexanol in a ratio by volume of from approximately 1:2 to approximately 1:4, and having a thickness of between approximately 10 µm and approximately 50 µm.

7. The method of claim 1, wherein said dried pastelike layer is dried at a temperature of between approximately 100° C. and approximately 200° C.

8. The method of claim 1, wherein said second film includes a polyester film having a thickness of between approximately 10 µm and approximately 100 µm.

9. The method of claim 1, wherein said first, structured supporting film, said dried pastelike layer and said second film having the electronic structure carried thereon are subjected to a pressure of between approximately 20 MPa and approximately 80 MPa for from about 5 seconds to about 20 seconds.

10. The method of claim 9, wherein said first, structured supporting film, said dried pastelike layer and said second film having the electronic structure carried thereon are subjected to a temperature of between approximately 40° C. and approximately 100° C. for a period of from about 5 seconds to about 20 seconds.

11. The method of claim 1, wherein said metal powder is silver or silver alloy.

12. The method of claim 4, wherein said second film includes a polyester film having a thickness of between approximately 10 µm and approximately 100 µm.

* * * * *